United States Patent [19]

Ma

[11] Patent Number: 4,792,993

[45] Date of Patent: Dec. 20, 1988

[54] TVRD RECEIVER SYSTEM WITH AUTOMATIC BANDWIDTH ADJUSTMENT

[75] Inventor: John Y. Ma, Milpitas, Calif.

[73] Assignee: Capetronic (BSR) Ltd., Kowloon, Hong Kong

[21] Appl. No.: 792,783

[22] Filed: Oct. 30, 1985

[51] Int. Cl.[4] .............................................. H03J 1/16
[52] U.S. Cl. ................................... 455/266; 455/339; 455/340
[58] Field of Search .............. 455/188, 189, 190, 191, 455/200, 266, 339, 340; 358/193.1

[56] References Cited

U.S. PATENT DOCUMENTS

| | | | |
|---|---|---|---|
| 3,218,641 | 11/1965 | Maynard | 455/266 |
| 4,124,817 | 11/1978 | Takahashi | 455/266 |
| 4,352,208 | 9/1982 | Schroeder | 455/266 |
| 4,356,567 | 10/1982 | Eguchi et al. | 455/200 |
| 4,356,568 | 10/1982 | Ogita et al. | 455/266 |
| 4,419,768 | 12/1983 | Yamashita et al. | 455/189 |
| 4,458,207 | 7/1984 | Favreau et al. | 455/266 |
| 4,551,755 | 11/1985 | Matsuda et al. | 455/266 |
| 4,563,651 | 1/1986 | Ohta et al. | 455/266 |

Primary Examiner—Robert L. Griffin
Assistant Examiner—Curtis Kuntz
Attorney, Agent, or Firm—Stephen G. Rudisill

[57] ABSTRACT

An improved TVRO receiver for receiving signals broadcast over a plurality of channels with varying bandwidths and having a tuner producing output signals corresponding to the received signals and having bandwidths which vary from channel to channel is provided with a band pass filtering arrangement receiving the output signals and having a controllably adjustable pass band, a bandwidth detection circuit for receiving the output signals passing through the filtering arrangement and being responsive to a current output signal corresponding to the channel being received for producing a control signal indicative of the extent of deviation of the bandwidth of the current output signal beyond the current pass band of the filtering arrangement, and a control circuit responsive to the control signal for adjusting the pass band of the filtering arrangement to accommodate the bandwidth of the current output signal corresponding to the channel being received, if the bandwidth deviation of the current output signal exceeds a predetermined threshold value.

16 Claims, 3 Drawing Sheets

TVRD RECEIVER SYSTEM WITH AUTOMATIC BANDWIDTH ADJUSTMENT

FIELD OF THE INVENTION

The present invention relates generally to receivers for TVRO earth stations which receive audio and video signals from a plurality of orbiting earth satellites. More particularly, the invention relates to a TVRO receiver system which automatically adjusts the bandwidth of the tuner to correspond to the bandwidth of the particular signal to which the TVRO receiver is tuned at any given time.

BACKGROUND OF THE INVENTION

In satellite communication systems, a transmitting earth station generates a modulated carrier in the form of electromagnetic waves up to a satellite, forming an "uplink." The incident electromagnetic waves are collected by the satellite, processed electronically to reformat the modulated carrier in some way, and retransmitted to receiving earth stations, forming "downlinks." The earth stations in these systems basically consist of a transmitting and/or receiving power station functioning in conjunction with an antenna subsystem and form strategic parts of the satellite communication system.

A TVRO earth station typically comprises a receiving antenna such as a paraboloidal dish, a low noise block conveter (or a low noise amplifier (LNA) and a down converter) located at an outdoor antenna site, and a receiver located near an indoor television set. The down converter and the receiver are usually connected by a coaxial cable.

A single transponder in a satellite can carry a color television channel, including both the video and audio information, and also several auxiliary services such as radio stations, newservice feeds, special news teletypewriter channels, high-speed stock market and commodity exchange data feeds, and/or teletext data services. A transponder normally has a usable modulating signal bandwidth of 8 to 10 MHz, and the video information normally occupies the band up to about 4.2 MHz. The audio portion of the television channel is placed on an FM subcarrier in the 5.8 to 7.4 MHz range (usually either 6.2 or 6.8 MHz), which leaves available all the other FM subcarrier frequencies located above 4.2 MHz. For example, in several of the satellites presently orbiting the earth, transponder owners feed separate audio subcarriers at 5.8, 6.2, 6.8 and 7.4 MHz. Other transponders on the same satellites carry music services at 5.58 and 5.76 MHz.

A satellite transponder may also be used to carry multiple narrow-band audio signals in place of a wideband video signal. These audio signals may be interspersed with other types of auxiliary services, and thus the exact frequency of the audio subcarriers can vary widely among the large number of transponders presently in orbit, and new subcarriers can become available at any time as more subcarrier services are squeezed onto existing transponders and as additional satellites are placed in orbit. Moreover, there is no fixed relationship among the numerous audio signals themselves.

The particular problem addressed by the present invention is that the numerous audio signals have widely varying bandwidths. Indeed, even the video signal bandwidths can vary; there is at least one satellite that currently transmits video signals in 18-MHz half-transponder format rather than the standard 36-MHz format. These varying bandwidths present a problem in the receiver, particularly in the audio tuner, because the receiver must have a passband wide enough to receive those signals having the widest bandwidths in order to avoid distortion, but then the receiver picks up a large amount of noise with those signals having much narrower bandwidths.

Current TVRO receivers often have a bandwidth adjustment knob which permits the user to select either a "wide" or a "narrow" passband. This is not only a very limited adjustment which often provides much less than optimum reception, but also imposes a bothersome and tedious burden on the user when he is attempting to select from among a large number of satellite signals.

SUMMARY OF THE INVENTION

It is a primary object of the present invention to provide an improved satellite receiver system which automatically tailors the receiver system to the different bandwidths of the numerous signals received by an earth station. In this connection, a related object of the invention is to provide such an improved receiver system which is particularly useful in TVRO earth stations because it eliminates the need for the user to manually adjust the receiver when it is tuned to a signal having a bandwidth different from that of the previous signal.

A further object of the invention is to provide an improved satellite receiver system which is simple and inexpensive to implement in an otherwise standard satellite receiver, and which does not significantly affect the overall cost of the receiver system.

Yet another object of this invention is to provide an improved satellite receiver system which does not require any input data or other intelligence concerning the bandwidths of the audio signals.

Other objects and advantages of the invention will be apparent from the following detailed description and the accompanying drawings.

In accordance with the present invention, a TVRO receiver having a tuner producing output signals having bandwidths which vary from channel to channel is improved by providing an automatic bandwidth control system comprising bandpass filtering means receiving the output signals and having a controllably adjustable pass band, bandwidth detecting means responsive to the output signals for producing a control signal in response to deviations of the bandwidth of the current output signal beyond the current pass band of the filtering means, and control means responsive to the control signal for adjusting the pass band of the filtering means to correspond to the bandwidth of the current output signal.

In a preferred embodiment of the invention, the bandpass filtering means comprises a plurality of IF passband filters for receiving signals having bandwidths which vary from channel to channel, the filters having pass bands of different widths, and the control means comprises switching means associated with the filters and responsive to the control signal for feeding the current output signals to a selected one of the filters having a pass band corresponding to the bandwidth of the current output signal.

BRIEF DESCRIPTION OF THE DRAWINGS

The invention and other objects and advantages thereof may best be understood by referring to the following description in conjunction with the accompanying drawings, in which.

DESCRIPTION OF THE PREFERRED EMBODIMENTS

Although the invention will be described in connection with certain preferred embodiments, it will be understood that it is not intended to limit the invention to those particular embodiments. On the contrary, it is intended to cover all alternatives, modifications and equivalent arrangements as may be included within the spirit and scope of the invention as defined by the appended claims.

Figure 1:
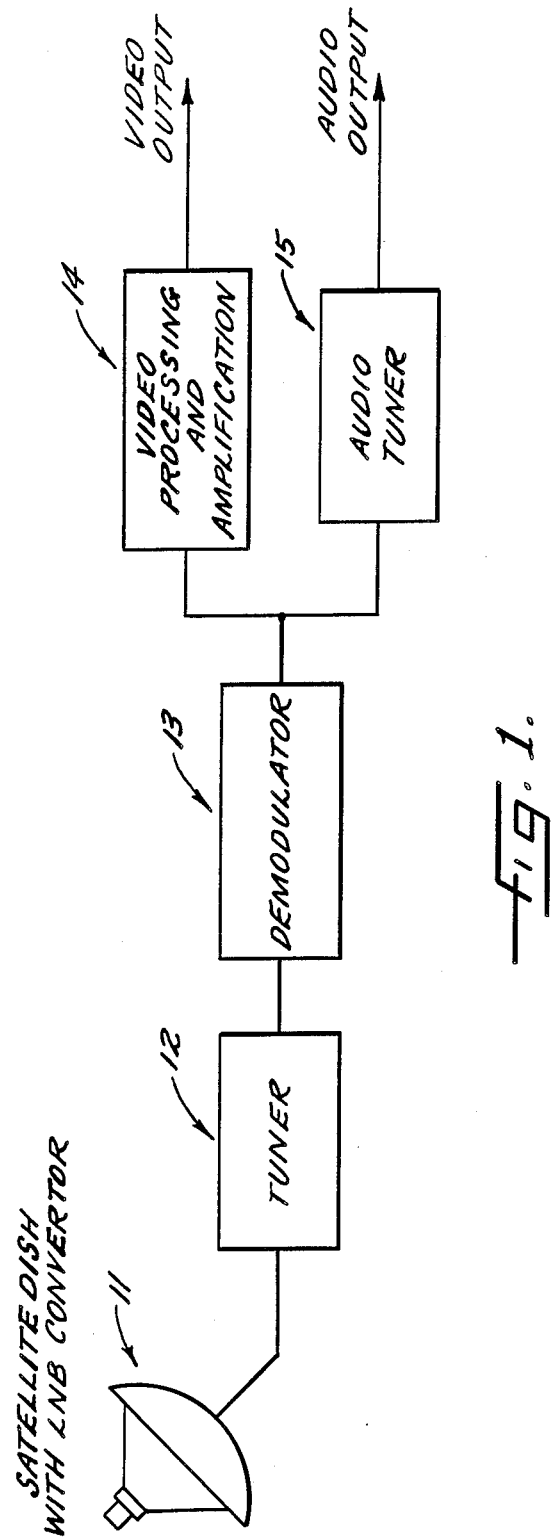
FIG. 1 is a simplified block diagram of a conventional TVRO earth station.

Referring now to the drawings, in FIG. 1 there is shown a functional block diagram of a TVRO earth station for the reception of satellite signals. The system includes an antenna 11, which is typically a paraboloidal dish equipped with a low noise block (LNB) converter and related accessories and positioning mechanisms, for capturing signals transmitted from orbiting satellites; and a receiver system including a tuner 12, a demodulator 13, a video processing and amplification section 14, and an audio tuner 15.

The antenna 11 receives signals transmitted from the satellite in the four-GHz frequency band (3.7 to 4.2 GHz); and this entire block of frequencies is converted to a 1st IF frequency range of 950 to 1450 MHz by the block converter located at the antenna site. The 1st IF signals are then sent via coaxial cable to the tuner 12 which selects a particular channel for viewing and converts the signals in that particular channel to a 2nd IF frequency range. The 2nd IF frequency range is preferably high enough to permit the 2nd IF VCO frequencies to be above the 1st IF block of frequencies, to prevent the VCO from interfering with the desired signals. For a 1st IF frequency range of 950 to 1450 MHz, this means that the center frequency of the second IF frequency range must be at least 500 MHz. A particularly preferred 2nd IF center frequency in the system of the present invention is 612 MHz.

In the demodulator 13, the 2nd IF signal is passed through an amplifier and a filter and on to a conventional video detector which demodulates the frequency-modulated signal to the baseband of the original video signal (e.g., 0 to 10 MHz), producing a composite video signal output. The filter preferably has a pass band that is only about 22 MHz wide; a pass band of this width passes the essential video and audio information while rejecting unwanted noise received by the antenna on the edges of the selected channel. The output of the demodulator comprises the baseband signals which range from DC to about 8.5 MHz; this includes video information from about 15 KHz to 4.2 MHz, and subcarriers from about 4.5 to 8.5 MHz.

Figure 2:
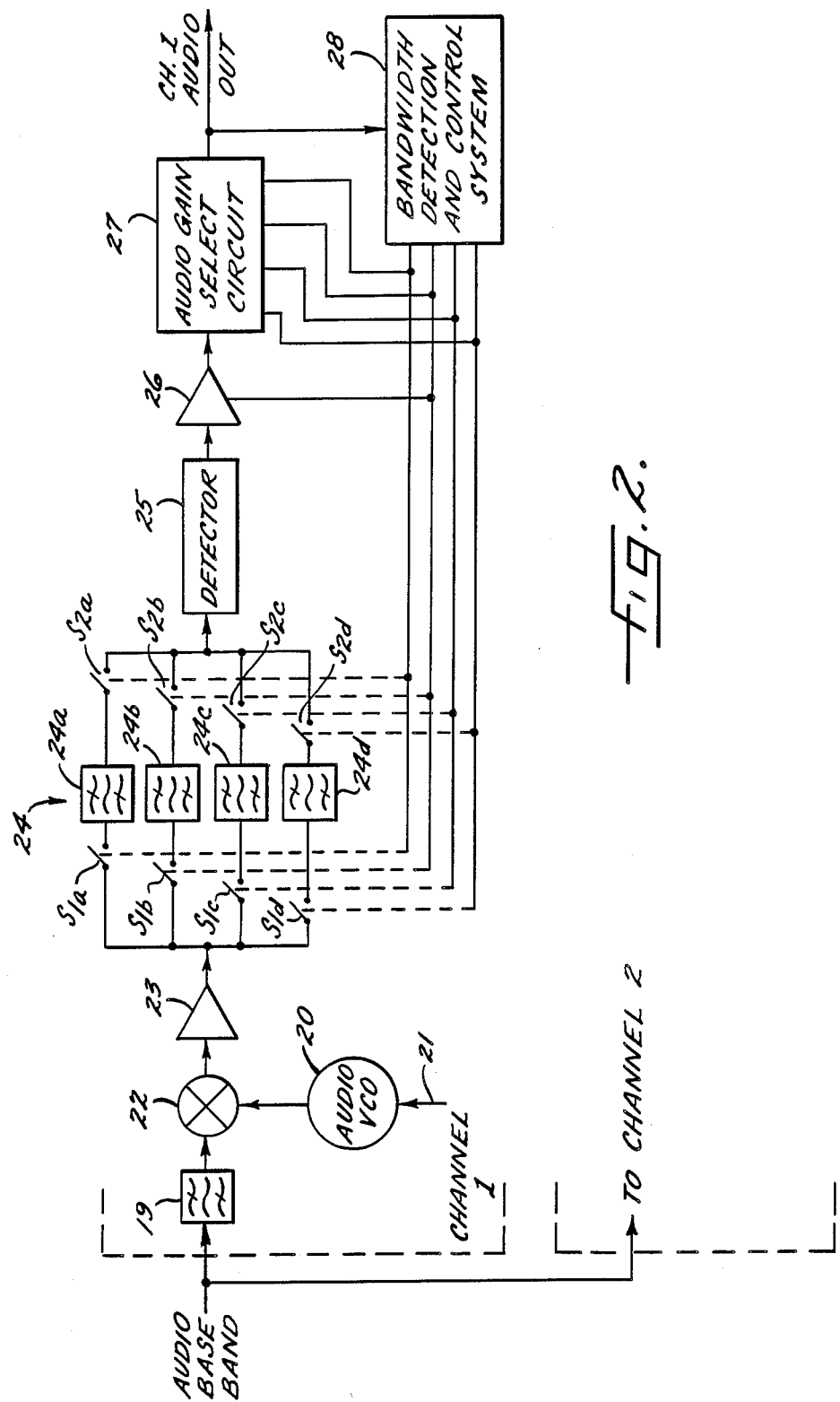
FIG. 2 is a block diagram of a preferred embodiment of the audio tuner included in the TVRO earth station of FIG. 1 and embodying the present invention.

The audio tuner 15, which is shown in more detail in FIG. 2, receives the baseband signals from the demodulator 13, which include the subcarriers above 4.5 MHz containing audio and other information. These baseband signals are initially passed through a bandpass filter 19 having a pass band of 4.5 to 8.5 MHz. The filter output is then fed to a superheterodyne circuit including a voltage-controlled oscillator 20 (referred to hereinafter as the "audio VCO") receiving a controlling DC input voltage on line 21, and a mixer 22 for combining the output of the audio VCO with the incoming baseband signals to increase the frequency of the incoming signals to a desired intermediate frequency (audio IF) range. The output of the mixer 22 is passed through an amplifier 23 and a filter 24 to a discriminator or detector 25 which is tuned to one particular audio IF frequency.

If the audio VCO produces an output frequency 10.7 MHz above the frequency of the desired audio signal, the frequency of the desired signal will be raised to an IF center frequency of 10.7 MHz at the output of the mixer 22. The detector 25 will then produce the desired audio output if it is tuned to the IF center frequency of 10.7 MHz, which is a typical IF center frequency for FM receivers.

The entire detector 25 is conventional and is included, for example, in the integrated circuit uPC1211V made by NEC Corporation. This particular circuit even includes an "AFC output", which is the signal that is conventionally used for "automatic frequency control" by applying it to a varactor diode included in the tuning circuit of the audio VCO 20.

The system illustrated in FIG. 2 is duplicated to permit simultaneous reception of stereo broadcasts. The audio outputs of the two parallel systems are then fed to a conventional stereo processor. Such a processor is capable of processing either monaural signals or any of the three types of stereo signals currently used for stereo broadcasts via satellite, namely:

(1) The "Matrix Method", which uses two separate subcarriers, one for the left-plus-right audio signal and the other for the left-minus-right audio signal.

(2) "Multiplex Stereo", which uses an FM subcarrier for a left-plus-right audio signal, a double sideband suppressed AM subcarrier for a left-minus-right signal, and a synchronizing signal for a stereo demodulator reference.

(3) The "Discrete Method", which uses one subcarrier for the right channel, and a second subcarrier for the left channel.

In accordance with one important aspect of the present invention, the receiver includes an automatic bandwidth control system comprising bandpass filtering means receiving the output signals with bandwidths that vary from channel to channel, the filtering means having a controllably adjustable pass band; bandwidth detecting means responsive to the output signals for producing a control signal in response to deviations of the bandwidth of the current output signal beyond the current pass band of the filtering means; and control means responsive to the control signal for adjusting the pass band of the filtering means to correspond to the bandwidth of the current output signal.

The passband adjustment automatically optimizes the receiver so that it both eliminates noise outside the bandwidth of the selected signal, and avoids signal distortion due to deviation of the signal bandwidth outside the pass band of the receiver. As will be apparent from the ensuing description, the automatic pass band adjustment may be continuously variable over the required range, or variable only among a discrete number of preselected pass bands.

In the illustrative embodiment of FIG. 2, the filter 24 includes four different filters 24a–24d tuned to different bandwidths. For example, the four filters 24a–24d may have pass bands of 100 KHz, 200 KHz, 400 KHz and 800 KHz, respectively. The four filters can be connected to, and disconnected from, the system by two bands of controllable switches 51a–51d and 52a–52d which receive controlling signals from a bandwidth detection and control system to be described below.

The output of the detector 25 is fed through an amplifier 26 and then on through an audio gain select circuit 27 which provides a stabilized and relatively constant range of demodulated output regardless of the bandwidth setting of the filter 24. The output of the audio gain select circuit 27 forms the audio output, and is also processed by a bandwidth detection and control system 28 to produce a control signal which varies with changes in the bandwidth of the detector output. More specifically, the bandwidth detection and control system 28 produces a DC voltage whose magnitude varies linearly with changes in the deviation of the bandwidth of the audio output (from circuit 27) from the 3-dB bandwidth of the filter 24. The filter 24 passes these deviations because the edges of the filter response characteristic below the 3-dB level are not sharp enough to cut off the deviations at those levels.

The DC voltage output of the system 28 controls the audio bandwidth of the receiver by controlling the switches 51a–51d and 52a–52d to determine which of the four filters 24a–24d is used for the processing of the particular audio signal to which the receiver is tuned at any given time. Thus, the bandwidth detection control system 28 serves as a means of automatically varying the receiver bandwidth on the basis of the modulation bandwidth of the selected signal.

The bandwidth control system 28 also controls the audio gain select circuit 27 to maintain a constant signal level at all the bandwidth settings, as will be described in more detail below.

Figure 3:
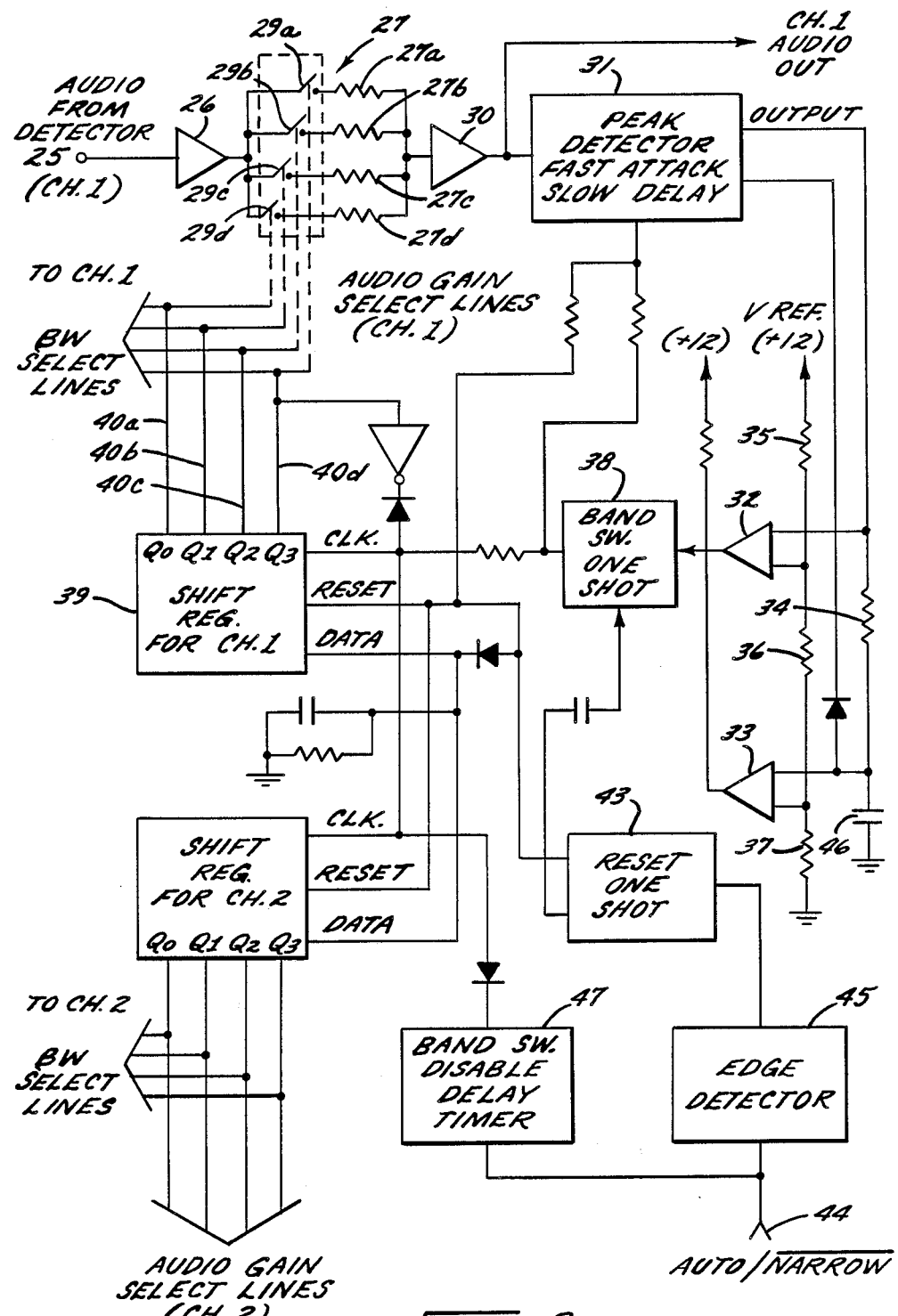
FIG. 3 is a more detailed schematic diagram of the automatic bandwidth control system included in the tuner of FIG. 2.

Referring now to FIG. 3, there is shown a more detailed diagram of the audio gain select circuit 27 and the automatic bandwidth detection and control system 28. The output of the amplifier 26 is passed through the audio gain select circuit 27 which includes four parallel resistors 27a–27d which can be selected by opening and closing four corresponding switches 29a–29d. The output of the gain select circuit 27 is fed through an amplifier 30 to a peak detector 31. By controlling the gain select circuit 27, the maximum output of the peak detector 31 is kept at a relatively constant level regardless of the bandwidth setting of the filter 24. In addition, this arrangement provides similar audio volume levels for both narrow and wide band signals.

The output of the peak detector 31 is supplied as a variable input to each of a pair of comparators 32 and 33, with the input to the second comparator 33 being supplied through a resistor 34. The other inputs to the comparators 32 and 33 are fixed inputs from a reference voltage $V_{REF}$ which is applied to the comparators through a voltage divider formed by a series of three resistors 35, 36 and 37 leading from the source of $V_{REF}$ to ground.

The outputs of the comparators 32 and 33 are tied together into one input of a monostable multivibrator 38 (referred to hereinafter as the "bandswitch one-shot"). The output of the bandswitch one-shot is applied to the clock input of a shift register 39 having four outputs Q0–Q3. These four outputs are connected to four band select lines 40a–40d which in turn control the two banks of band switches S1a–S1d and S2a–S2d that determine which of the individual filters 24a–24d is connected into the system at any given time. The bandswitch one-shot 38 and the shift register 39 also receive inputs from a reset one-shot 43. A control line 44 receives a signal, designated as the "auto/narrow" signal, which forms the input to the reset one-shot 43 after being processed by an edge detector 45.

The auto/narrow control signal is generated in response to actuation of a channel selection switch on the front panel of the receiver and is set high each time a new channel or station is selected by the user. The edge detector 45 functions to produce an output any time the status of the auto/narrow signal changes. This changes the output of the reset one-shot 43 which in turn resets the shift register 39 and also actuates the bandswitch one-shot 38 so that binary zeros are clocked into all the shift register output lines. In this mode the system selects the filter that has the most narrow bandwidth. Thus, every time a new station is selected, the audio bandwidth of the receiver is set to the minimum of the available range, which is the optimum setting for the reception of signals broadcast with a narrow modulation bandwidth.

If the signal to which the receiver is tuned is beyond the selected bandwidth of the filter 24, the peak detector 31 senses this deviation and increases the variable input signal to the comparator 32. The comparator 32 compares this input with its fixed input from the reference voltage $V_{REF}$ and produces an output only if the signal from the peak detector 31 exceeds the fixed reference voltage $V_{REF}$ by a predetermined amount, e.g., if the peak detector output is at least 140% of $V_{REF}$.

The peak detector 31 has a fast rise or "attack" time so that it responds quickly to any single peak, and a relatively slow decay time so that its output can be held long enough to cause the second comparator 33 to respond to a series of smaller peaks which are below the threshold level that produces an output from the first comparator, e.g., below 140% of $V_{REF}$. A series of such small peaks will not produce a signal above the threshold of the first comparator and yet the rate of occurrence and/or the widths of the peaks may still indicate that the bandwidth of the desired signal is exceeding the pass band of the currently selected filter. Thus, the output of the peak detector is supplied to a capacitor 46 via the resistor 34 so that a series of small peaks within a relatively short time period, e.g., 2 or 3 minutes, will gradually increase the signal level at the variable input to the comparator 33. The fixed reference input to this comparator is at a level such that the comparator produces an output only if its variable input exceeds 105% of the reference voltage $V_{REF}$. An output signal from the comparator 33 has the same effect as the output of the comparator 32, i.e., a filter having the next widest bandwidth is switched into the system.

The above arrangement ensures that both significant deviations and sustained marginal deviations of the audio signals beyond the bandwidth of a given filter setting are tracked in order to control the filter bandwidth. Thus, if the incoming subcarrier signal suddenly undergoes a large frequency shift which necessitates increased bandwidth, the output of the comparator 32 changes immediately, thereby causing a shift to the filter having the next widest bandwidth. If the deviation of the signal bandwidth is only marginally beyond the currently selected filter bandwidth, the comparator 32 does not respond, but the comparator 33 responds if the marginal deviation persists long enough and/or occurs frequently enough to cause the variable input to the comparator 33 to exceed 105% of the reference voltage $V_{REF}$. This feature avoids the undesired shifting of filters due to spurious peaks which are more likely to occur at the lower magnitudes. A bandswitch disable delay timer 47 holds the system in this narrowest bandwidth mode for a selected time interval following each reset pulse.

Each time it is found that the bandwidth of a given filter setting has been exceeded by the incoming signals, as indicated by the output of one of the comparators 32 and 33 going high, the shift register 39 is clocked so that one of the outputs of the shift register goes high. This, in turn, causes the filter with the next widest bandwidth to be switched into the system. This process is automatic and continues until the filter with the largest bandwidth is switched into the system. Simultaneously with the automatic filter switching, corresponding changes in the audio gain select circuit 27 are also effected so that each time a different filter is activated the detector output is prescaled to the constant voltage range to which the peak detector is designed to be sensitive.

When the receiver is tuned to a new channel, the auto-narrow control signal goes high. The edge detector 45 detects this change in status and triggers the reset one-shot 43 which in turn triggers the bandswitch one-shot 38 and changes the data status of the shift register section 39. This results in a resetting of all the data lines in the shift register 39 to a binary zero, and the automatic bandwidth selection procedure as described above is again set into motion.

We claim:

1. In a TVRO receiver for receiving signals broadcast over a plurality of channels with varying bandwidths and having a tuner producing output signals corresponding to selected ones of said received signals and having bandwidths which vary from channel to channel, the improvement comprising
    bandpass filtering means receiving said output signals and having a controllably adjustable pass band,
    bandwidth detecting means for receiving the output signals passing through said filtering means, said detecting means being responsive to a current output signal corresponding to the channel being received for producing a control signal indicative of the extent of deviation of the bandwidth of the current output signal beyond the current pass band of said filtering means, said control signal being substantially independent of the signal level of broadcast signals received by said tuner, and
    control means responsive to said control signal for adjusting the pass band of said filtering means to accommodate the bandwidth of the current output signal corresponding to the channel being received, if the bandwidth deviation of said current output signal exceeds a predetermined threshold value.

2. The TVRO receiver of claim 1 wherein said tuner is fed by means provided in the receiver for receiving the broadcast signals and converting said signals to first IF signals, said tuner receiving and converting said 1st IF signals to a 2nd IF frequency range, demodulator means provided in the receiver for receiving said 2nd IF signals and producing output signals which vary in proportion to deviations in the frequency of said 2nd IF signals from the center frequency of said 2nd IF frequency range, said demodulator output signals being fed to said filtering means.

3. The TVRO receiver of claim 2 wherein the demodulator means produces output signals having peak levels proportional to the bandwidth of said 2nd IF signals received by the demodulator.

4. The TVRO receiver of claim 1 wherein said bandwidth detecting means includes a peak detector for producing said control signal in response to deviations of the current output signal beyond the passband of said filtering means.

5. The TVRO receiver of claim 4 wherein the control means includes means for adjusting the pass band of said filtering means in response to (1) a single deviation of said output signal beyond a first predetermined threshold outside the current pass band, or (2) repeated deviations of said output signal beyond a second predetermined threshold outside the current pass band, said second threshold being closer to the existing pass band than said first threshold.

6. The TVRO receiver of claim 1 which includes means for amplifying the output of said filtering means before it reaches said bandwidth detecting means, and means associated with said amplifying means for automatically adjusting the gain of said amplifying mean in response to said control signal from said bandwidth detecting means so as to maintain the amplitude of said output signal within a relatively constant range regardless of the width of the pass band of said filtering means.

7. The TVRO receiver of claim 1 which includes demodulator means for feeding said tuner and producing video and audio baseband signals corresponding to said received broadcast signals, and said tuner is an audio tuner receiving only said audio baseband signals form said demodulator means in order to produce said corresponding output signals.

8. The TVRO receiver of claim 7 wherein said audio tuner includes a superheterodyne circuit for converting the audio baseband signals to an audio IF frequency range, and a detector for detecting an audio signal at a prescribed audio IF frequency in the output of said superheterodyne circuit, said filtering means being located between said superheterodyne circuit and said detector, and said bandwidth detecting means receives the output of said detector.

9. A TVRO receiver as set forth in claim 1 wherein said filtering means comprises a plurality of IF passband filters for receiving signals having bandwidths which vary from channel to channel, said filters having pass bands of different widths, and said control means includes switching means associated with said filters and responsive to said control signal for feeding said output signals to a selected one of said filters having a pass band capable of accomodating the bandwidth of the current output signal.

10. In a TVRO receiver for receiving signals broadcast over a plurality of channels with varying bandwidths and having a tuner producing output signals corresponding to selected ones of said received signals and having bandwidths which vary from channel to channel, the improvement comprising
    bandpass filtering means receiving said output signals and having a controllably adjustable pass band,
    bandwidth detecting means for receiving the output signals passing through said filtering means, said detecting means being responsive to a current output signal corresponding to the channel being received for producing a control signal indicative of the extent of deviation of the bandwidth of the current output signal beyond the current pass band of said filtering means, control means responsive to said control signal for adjusting the pass band of said filtering means to accommodate the bandwidth of the current output signal corresponding to the channel being received, if the bandwidth deviation of said current output signal exceeds a predetermined threshold value, and means for amplifying the output of said filtering means before it reaches said bandwidth detecting means, and means associated with said amplifying means for automatically adjusting the gain of said amplifying means in response to said control signal from said bandwidth detecting means so as to maintain the amplitude of said output signal within a relatively constant range regardless of the width of the pass band of said filtering means.

11. In a TVRO receiver for receiving signals broadcast over a plurality of channels with varying bandwidths and having a tuner producing output signals corresponding to selected ones of said received signals and having bandwidths which vary from channel to channel, the improvement comprising bandpass filtering means receiving said output signals and having a controllably adjustable pass band, said filtering means comprising a plurality of IF passband filters for receiving signals having bandwidths which vary from channel to channel, said filters having pass bands of different widths, bandwidth detecting means for receiving the output signals passing through said filtering means, said detecting means being responsive to a current output signal corresponding to the channel being received for producing a control signal indicative of the extent of deviation of the bandwidth of the current output signal beyond the current pass band of said filtering means, and control means responsive to said control signal for adjusting the pass band of said filtering means to accommodate the bandwidth of the current output signal corresponding to the channel being received, if the bandwidth deviation of said current output signals exceeds a predetermined threshold value, said control means including switching means associated with said filters and responsive to said control signal for feeding said output signals to a selected one of said filters having a passband corresponding to the bandwidth of the current output signal.

12. In a TVRO receiver for receiving signals broadcast over a plurality of channels with varying bandwidths and having a tuner producing output signals corresponding to selected ones of said received signals and having a bandwidths which vary from channel to channel, the improvement comprising bandpass filtering means receiving said output signals and having a controllably adjustable pass band, bandwidth detecting means for receiving the output signals passing through said filtering means, said detecting means including peak detection means responsive to a current output signal corresponding to the channel being received for producing a control signal indicative of the extent of deviation of the bandwidth of the current output signal beyond the current pass band of said filtering means, control means responsive to said control signal for adjusting the pass band of said filtering means to accommodate the bandwidth of the current output signal corresponding to the channel being received, if the bandwidth deviation of said current output signal exceeds a predetermined threshold value, said control means including means for adjusting the pass band of said filtering means in response to (1) a signal deviation of said output signal beyond a first predetermined threshold outside the current pass band, or (2) repeated deviations of said output signal beyond a second predetermined threshold outside the current pass band, said second threshold being closer to the existing pass band than said first threshold.

13. In a TVRO receiver for receiving signals broadcast over a plurality of channels with varying bandwidths and having a tuner producing output signals corresponding to selected ones of said received siganls and having bandwidths which vary from channel to channel, said tuner being fed by means provided in the receiver for receiving the broadcast signals and converting said signals to first IF signals, said tuner receiving and converting said first IF signals to a second IF frequency range, demodulator means provided in the receiver for receiving said second IF signals and producing output signals which vary in proportion to deviations in the frequency of said second IF signals from the center frequency of said second IF frequency range, the improvement comprising bandpass filtering means receiving said demodulator output signals and having a controllably adjustable pass band, bandwidth detecting means for receiving the output signals passing through said filtering means, said detecting means being responsive to a current output signal corresponding to the channel being received for producing a control signal indicative of the extent of deviation of the bandwidth of the current output signal beyond the current pass band of said filtering means, and control means responsive to said control signal for adjusting the pass band of said filtering means to accommodate the bandwidth of the current output signal corresponding to the channel being received, if the bandwidth deviation of said current output signal exceeds a predetermined threshold value.

14. The TVRO receiver of claim 13 wherein the demodulator means produces output signals having peak levels proportional to the bandwidth of said second IF signals received by the demodulator.

15. In a TVRO receiver for receiving signals broadcast over a plurality of channels with varying bandwidths and having demodulator means producing video and audio baseband signals corresponding to said received broadcast signals, an audio tuner for receiving the audio baseband signals from said demodulator means and producing output signals corresponding to selected ones of said received signals and having bandwidths which vary from channel to channel, the improvement comprising bandpass filtering means receiving said output signals and having a controllably adjustable pass band, bandwidth detecting means for receiving the output signals passing through said filtering means, said detecting means being responsive to a current output signal corresponding to the channel being received for producing a control signal indicative of the extent of deviation of the bandwidth of the current output signal beyond the current pass band of said filtering means, and control means responsive to said control signal for adjusting the pass band of said filtering means to accommodate the bandwidth of the current output signal corresponding to the channel being received, if the band width deviation of said current output signal exceeds a predetermined threshold value.

16. The TVRO receiver of claim 15 wherein said audio tuner includes a superheterodyne circuit for converting the audio baseband signals to an audio IF frequency range, and a detector for detecting an audio signal at a prescribed audio IF frequency in the output of said superheterodyne circuit, said filtering means being located between said superheterodyne circuit and said detector, and said bandwidth detecting means receives the output of said detector.

* * * * *